US006423206B1

(12) United States Patent
Haby et al.

(10) Patent No.: US 6,423,206 B1
(45) Date of Patent: Jul. 23, 2002

(54) METHOD FOR ELECTROCHEMICAL ROUGHENING OF A SUBSTRATE

(75) Inventors: Georg Haby, Liederbach; Raimund Haas, Kelkheim; Uwe Gartmann, Eltville; Günter Hultzsch, Wiesbaden; Klaus Joerg, Ingelheim; Jörg Kaden, Klingelbach; Hermann Idstein, Oestrich-Winkel, all of (DE)

(73) Assignee: Agfa-Gevaert N.V., Mortsel (BE)

( * ) Notice: Subject to any disclaimer, the term of this patent is extended or adjusted under 35 U.S.C. 154(b) by 0 days.

(21) Appl. No.: 09/516,805

(22) Filed: Mar. 1, 2000

(30) Foreign Application Priority Data

Mar. 2, 1999 (DE) .......................................... 199 08 884

(51) Int. Cl.[7] .......................... B23H 3/00; B23H 11/00; C25F 3/00; H05K 3/07

(52) U.S. Cl. ....................... 205/652; 205/646; 205/659; 205/651; 205/686

(58) Field of Search ................................ 205/646, 659, 205/686, 651, 652; 204/DIG. 9

(56) References Cited

U.S. PATENT DOCUMENTS

| | | | | |
|---|---|---|---|---|
| 3,691,030 | A | | 9/1972 | Stroszynski |
| 3,851,421 | A | | 12/1974 | Stroszynski |
| 4,272,342 | A | | 6/1981 | Oda et al. |
| 4,915,800 | A | | 4/1990 | Nakanishi et al. |
| 5,045,157 | A | | 9/1991 | Nishino et al. |
| 5,082,537 | A | | 1/1992 | Stroszynski et al. |
| 5,271,818 | A | | 12/1993 | Stroszynski et al. |
| 6,080,288 | A | * | 6/2000 | Schwartz et al. ....... 204/224 R |

FOREIGN PATENT DOCUMENTS

| | | |
|---|---|---|
| DE | 1962728 | 6/1971 |
| DE | 1962729 | 6/1971 |
| DE | 3142488 | 5/1983 |
| DE | 3842454 | 7/1989 |
| DE | 3910450 | 11/1989 |
| DE | 3910213 | 10/1990 |
| EP | 0585586 A1 | 3/1994 |
| EP | 0 585586 | 3/1994 |
| JP | 63268239 | 11/1988 |

* cited by examiner

*Primary Examiner*—Bruce F. Bell
*Assistant Examiner*—Wesley A. Nicolas
(74) *Attorney, Agent, or Firm*—Roberts & Mercanti, LLP

(57) ABSTRACT

To avoid or minimize the occurrence of cross streaks or current streaks on a substrate that is transported through an electrolytic bath and roughened electrochemically in it, the current density is regulated in the electrolyte between a first alternating or three-phase current electrode and the substrate in such a way that at the beginning of a roughening zone, the current density has a lesser value than within the roughening zone, in the transport direction of the substrate. Downstream of the first alternating or three-phase current electrode, either a further alternating current electrode or a further three-phase current electrode acts on the substrate. In a preferred embodiment, the first alternating or three-phase current electrode has a rounded outline, which is composed of a curved portion and adjoining it a straight portion.

7 Claims, 4 Drawing Sheets

METHOD FOR ELECTROCHEMICAL ROUGHENING OF A SUBSTRATE

BACKGROUND OF THE INVENTION

1. Field of the Invention

The invention relates to a method and an apparatus for electrochemically roughening a substrate for light-sensitive layers. The surface of the substrate is roughened electrochemically, or mechanically and subsequently electrochemically in an aqueous electrolyte bath by the application of an alternating or three-phase current to electrodes opposite the substrate, while the substrate is passed continuously through the electrolyte bath.

2. Description of the Related Art

Such substrates are used to produce pre-sensitized printing plates wherein the material comprising the substrates, which are processed in plate or strip form, is a metal, especially aluminum. Roughening of aluminum strips, for instance, for producing printing plates is done mechanically, chemically, or electrochemically, or by a combination of these roughening methods. The goal for the aluminum surface, which is used for carrying water and for the adhesion of a light-sensitive layer, is to have a certain structure and uniformity. In mechanical roughening, the surface structures have pyramid-like shapes and have different orientations longitudinally and transversely (anisotropy), while electrochemically roughened aluminum surfaces have a sponge-like structure with many tiny wells and indentations of uniform geometry longitudinally and transversely (isotropy).

In the roughening of a printing plate substrate in an electrolyte by means of alternating current in a continuous process, crosswise striations occur, also known as cross streaks, especially at low frequencies and high web speeds.

These cross streaks occur at the entry or shortly before the entry of the printing plate substrate into the operative range of the first alternating current electrode. The surface of the unroughened printing plate substrate has a nonlinear quality electrically. The cause of this nonlinear quality can be coatings of both organic and inorganic material. Especially in printing plate substrates of aluminum, an aluminum oxide coating on the surface behaves in nonlinear fashion until it has worn down completely.

Not until the coatings on the surface have worn down does a method ensue in which the current density is dependent only on the voltage and not additionally on the nature of the surface.

Depending on whether a positive or negative current first flows through part of the surface, the resistance of the surface of the printing plate substrate decreases. If some of the surface has a low resistance, then the current preferentially flows through this portion of the surface and not through the portion of the surface that has higher resistance. The higher current then causes a further decrease in the resistance. This decrease is greater than the decrease in the resistance at those points of the surface through which a lesser current flows. The differences in resistance of the surface are thus amplified still further.

Because of the variable distribution of the current density over the cross-sectional area and the change in current density as a function of the surface resistance of the substrate, electrical cross streaks develop on the substrate that are visible in the form of striations. These striations correspond to the current distribution, which is predetermined by the form of the inlet electrode. The cross streaks occur at the cycle of the alternating or three-phase current that is applied to the electrodes, depending on whether a positive or a negative half-wave arrives first.

The cross streaks, also generally known as crosswise striations or current striations, impair the visual appearance of the product, and if they are especially sharply pronounced, its quality as well. The development of these crosswise striations or current striations increases if there is high current density in the electrolyte bath at the beginning of the electrochemical roughening. The electrical behavior of the printing plate substrate and of the electrolyte is not linear at the onset of roughening, as has already been mentioned above, and varies as the roughening progresses. The loss of uniformity in the visual appearance and the loss of print quality, if the cross streaks are especially pronounced, is highly disadvantageous in the duplication of high-resolution images.

Various methods are known to avoid these cross streaks. The surface of the printing plate substrate can be provided with an additional layer, as described in German Patent DE 38 42 454 C2. By means of this additional layer, nonuniformities in the material that essentially cause spots are compensated for. The formation of crosswise striations is indeed also attenuated by this provision, but the cause of the crosswise striations is still not eliminated since this cause resides in the steep increase in current density at the entry of the substrate into the operative region of the alternating current electrode. Even with uniform coating, the crosswise striations develop, depending on whether the positive or negative half-wave of the alternating current flows first. The expense for technical equipment is high, since it is usually necessary to apply an oxide layer in an additional electrolyte. It is true that to reduce the expense the same electrolyte can be used, but the electrolytes suitable for the roughening are typically not suited, or only have limited suitability, for oxidation or for the application of other layers.

In German patent DE 39 10 450 C2, a method for producing a printing plate substrate is described in which the surface of the printing plate substrate is roughened electrochemically in an acid electrolyte using an alternating current at a frequency of 80–100 Hz, and in which the ratio of anode time to period time is from 0.25 to 0.20. Such a method requires a major expenditure for circuitry because of the high power converted, and also presents problems in the distribution of the current to the individual electrodes.

Roughening using alternating current of high, variable frequency, as described in German patent disclosure DE 39 10 213 A1, leads to a decrease in the intensity of the crosswise striations, but requires major expense for electrical equipment and limits the frequency range of the alternating current that can be utilized for optimal shaping of the surface of the printing plate substrate.

Roughening of the printing plate substrate at certain transport speeds, as have been proposed in European patent EP 0 585 586 B1, does furnish a constant imposition of equal-sized positive and negative half-waves of the alternating current on each part of the printing plate substrate, but does not take into account the fact that crosswise striations are formed essentially by the incident half-waves upon entry into the zone of the alternating current roughening.

The known methods and apparatuses do take into account or reduce the development of crosswise striations during the complete passage of the printing plate substrate through the alternating current roughening zone, but they do not prevent crosswise striations from developing at the entry of the printing plate substrate into the operative region of the alternating or three-phase current electrodes, since the current density, or the current per unit of surface area on the printing plate substrate, is of variable magnitude.

SUMMARY OF THE INVENTION

The invention provides a method for electrochemically roughening a substrate for light-sensitive layers, which comprises electrochemically roughening the surface of a metal substrate in an aqueous electrolyte bath by the application of an alternating or three-phase current to electrodes opposite the substrate while the substrate is transported continuously in a transport direction through the electrolyte bath in a roughening zone between the substrate and the first alternating or three-phase current electrode, wherein at an entry point of the substrate into the roughening zone, the current density in the electrolyte bath between the first alternating or three-phase current electrode and the substrate is less than a maximum current density for the roughening, and that the current density between the substrate and the first alternating or three-phase current electrode increases continuously up to the maximum current density with increasing distance from the entry point.

The invention also provides an apparatus for electrochemically roughening a substrate for light-sensitive layers which comprises an alternating or three-phase current electrode disposed in an electrolyte bath, which electrode has a rounded outline such that its spacing from a substrate when the substrate is passed through the electrolyte bath is greater at an entry point into a roughening zone of the electrolyte bath between the substrate and the first alternating or three-phase current electrode than within the roughening zone, and that beyond a predetermined distance from the entry point the spacing of the alternating or three-phase current electrode from the substrate is constant.

The invention further provides an apparatus for electrochemically roughening a substrate for light-sensitive layers which comprises a first alternating or three phase current electrode which spaced from a substrate in an electrolyte bath, which electrode is subdivided into electrode portions which are insulated from one another, wherein each of the electrode portions is connected to an electrical component each of which has an ohmic resistance and/or inductive and capacitive resistances, and each component of each electrode portion is connected in series with or parallel to the other components of the other electrode portions and is connected with them to an alternating or three-phase current source.

The invention further provides an apparatus for electrochemically roughening a substrate for light-sensitive layers which comprises pairs of perforated elements disposed between a first alternating or three-phase current electrode and a substrate in an electrolyte bath wherein the pairs of elements are spaced apart from one another, and wherein the elements of each pair are displaceable relative to one another.

It is accordingly the object of the present invention to improve a method of the type defined at the outset and an apparatus for performing the method in such a way that the formation of cross streaks is prevented or minimized.

This object is attained in such a way that at an entry point of the substrate into the roughening zone, the current density in the electrolyte between a first alternating or three-phase current electrode and the substrate is less than a maximum current density for the roughening, and that the current density increases continuously up to the maximum current density with increasing distance from the entry point within the region of the first alternating or three-phase current electrode.

In a feature of the invention, the increase in the current density in the electrolyte bath over the course of one period of the alternating or three-phase current amounts to less than 20% of the maximum current density.

An apparatus for performing the method is characterized in that an alternating or three-phase current electrode disposed in the electrolyte bath is curved in such a way that its spacing from a substrate passed through the electrolyte bath is greater at an entry point into a roughening zone of the electrolyte bath than within the roughening zone, and that beyond a predetermined distance from the entry point, the spacing of the alternating or three-phase current electrode from the substrate is constant.

In a further feature of the apparatus, the curved outline of the alternating or three-phase current electrode has a parabolic portion which is adjoined by a straight portion.

In a further feature of the apparatus, the first alternating or three-phase current electrode is subdivided into electrode portions, and the individual electrode portions comprise materials of different electrical conductivities. Expediently, insulating plates are disposed between the electrode portions and a further alternating or three-phase current electrode.

With the invention, the advantage is attained that by the shaping, the selection of material, and/or the different total resistances comprising ohmic and/or inductive and capacitive resistances of the alternating or three-phase current electrode, the increase in current density over the course of one period of the alternating or three-phase current is less than or equal to 20% of the maximum current density, so that cross streaks cannot occur, or only a very limited development of cross streaks occurs.

The invention will be described in further detail below in conjunction with exemplary embodiments shown in the drawings.

DETAILED DESCRIPTION OF THE PREFERRED EMBODIMENT

Figure 1:
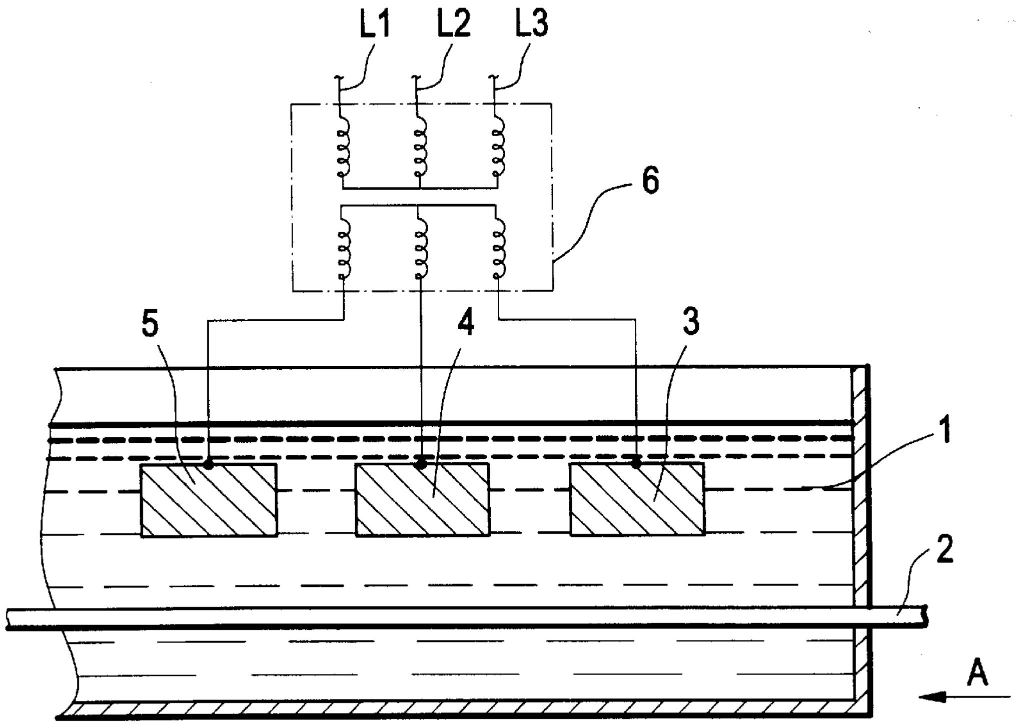
FIGS. 1 and 2 show schematic apparatuses for electrochemical roughening employing alternating or three phase current in accordance with the prior art.
Figure 2:
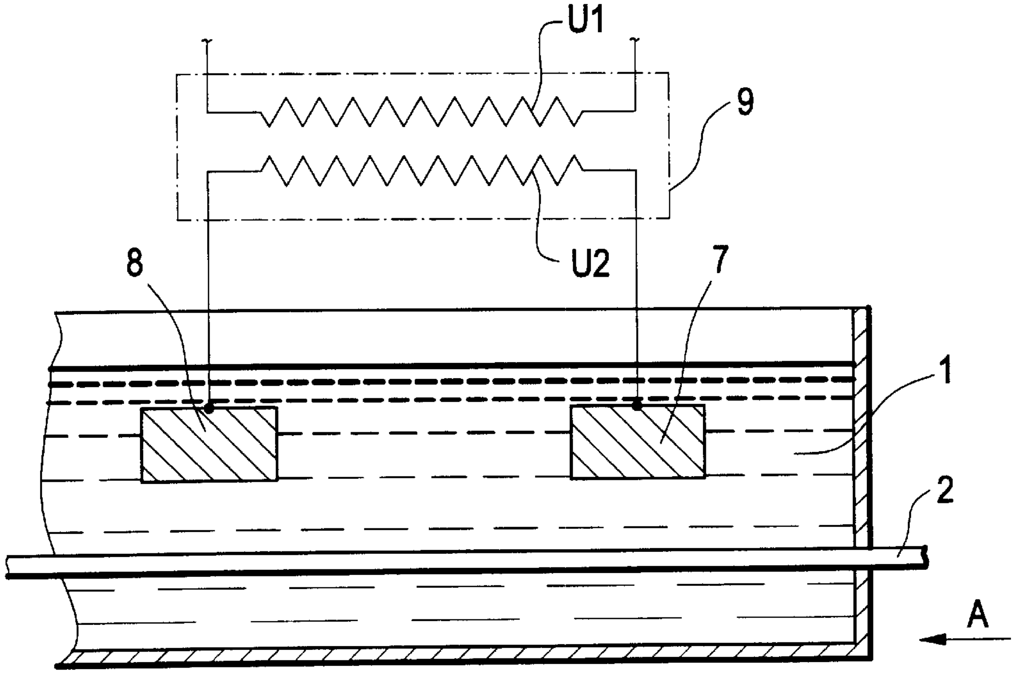

FIG. 1 schematically shows an apparatus known in the prior art, which comprises an electrolytic bath 1 through which a web substrate 2 is moved in the transport direction A. The electrolyte in the electrolytic bath 1 can be, for example, dilute, aqueous, nitric, sulfuric or hydrochloric acid. A combination of two or three acids can also be employed. It is understood that other acid baths that are known to those skilled in the art are also suitable for the electrolytic bath 1. Besides acid, the electrolytic bath can contain other chemicals, such as salts or surfactants. As a rule, the substrate, before the electrochemical roughening, is pretreated with an acidic or alkaline etchant, in order to remove rolling oils, contaminants, and natural oxides formed in the air. The equipment used for this is not shown. The substrate 2 can be mechanically or chemically roughened in a suitable manner before it enters the electrolytic bath 1. The equipment for the mechanical roughening of the surfaces of the substrate 2 are also not shown. Such systems and equipment are described and shown in German patent disclosures DE-A 19 62 729 and DE-B 19 62 728, among others. In the electrolytic bath 1 itself, only an electrochemical roughening of the surface of the substrate 2 takes place. Electrodes 3, 4, 5 are disposed in the electrolytic bath 1, spaced apart from the substrate 2, and are connected to three windings, not identified by reference numeral, of a secondary side of a three phase current transformer 6. The corresponding three windings on the primary side of the three phase current transformer 6 are connected via lines L1, L2, L3 to regulating transformers, not shown, which are supplied from a common power transformer for three phase current It is also possible for the lines L1, L2, L3 to be connected directly to the power transformer, omitting the regulating transformers. If no further provisions are made, then current streaks or electrical cross streaks result at high transport speeds of the substrate. These are caused as a function of the high increase in current density in the electrolyte between the first three phase current electrode 3 and the substrate 2. In the apparatus of FIG. 2, which is also known in the art, two alternating current electrodes 7 and 8 are located in an electrolytic bath 1 and are connected to a secondary winding U2 of an alternating current transformer 9. Once again, unless further measures are taken, current streaks or electrical cross streaks occur as a result of the high increase in current density in the electrolyte between the first alternating current electrode 7 and the substrate 2 at high transport speeds of the substrate.

The apparatuses according to the invention, shown in FIGS. 3–7, avoid these cross streaks. In each case the first alternating or three-phase current electrode is designed by shaping or a special selection of materials with different conductivities and/or electrode portions of different electrical properties because of ohmic, inductive and capacitive resistances that are connected to the electrode portions, in such a way that the increase in the current density over the course of one period of the alternating or three phase current is less than 20% of the maximum current density.

A slight change in the alternating or three phase current is hardly perceptible, because of the low, different conductivity at the surface of the substrate. Those portions of the surface of the substrate that have experienced no or only a slight reduction in resistance because of the originally applied alternating or three phase current are acted upon by the same current density as those parts of the surface where the reduction in resistance was somewhat greater. Because of the slight change in the alternating or three phase current, only a slight difference in the absolute values of the conductivities of different parts of the surface of the substrate exists. It is true that the conductivities differ from one another, but because of the slight change in current, these differences are not highly perceptible. In other words, this means that the increase or reduction in the conductivities at different parts of the surface of the substrate is insufficient to form cross streaks, or else the development of cross streaks is so slight that it is hardly detectable.

Figure 3:
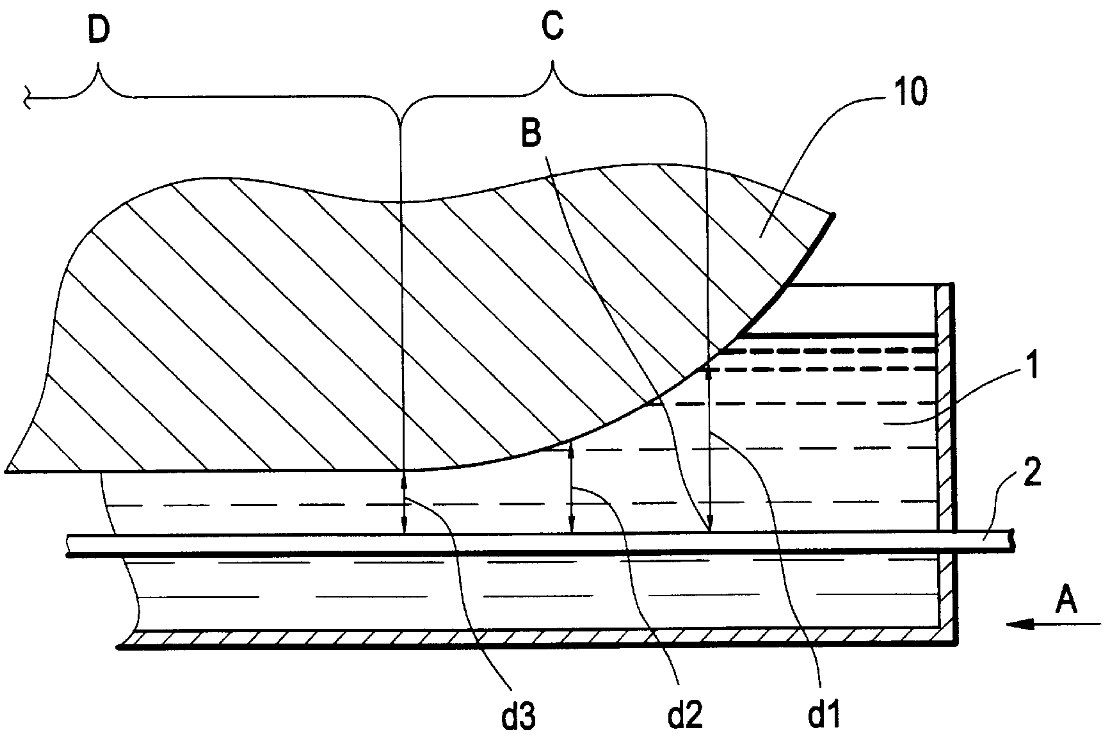
FIG. 3 schematically shows an alternating or three-phase current electrode of a first embodiment of the apparatus according to the invention.

In the first embodiment, shown in FIG. 3, in an apparatus according to the invention, only a first alternating current or three-phase current electrode 10 in an electrolyte bath is shown on a larger scale. The first alternating or three-phase current electrode 10 is rounded or curved in shape, in contrast to the respective three phase current or alternating current electrodes 3 and 7 in the apparatuses known from the prior art for roughening substrates 2, as shown schematically in FIGS. 1 and 2, respectively. The three phase current and alternating current electrodes shown in these figures have a generally elongated, rectangular cross section. As a result, as already explained above, the increase in current density between these electrodes and the substrate 2 upon entry of the substrate 2 into the roughening zone is very great, which leads to the undesired cross streaks. When in the further course of this description, an alternating or three-phase current electrode is referred to, it should be understood that this electrode is acted upon by either three phase current or alternating current, as has been described in conjunction with FIGS. 1 and 2.

The alternating or three-phase current electrode 10 that dips into the electrolyte bath 1 is curved in such a way that its spacing d1 from the substrate 2 passed through the electrolyte bath 1 is greater at an entry point B than inside the roughening zone C–D. The spacing of the alternating or three-phase current electrode 10 from the substrate 2 decreases in the transport direction A of the substrate 2, as indicated by the spacings d2 and d3. At the entry point B, with the spacing d1 between the alternating or three-phase current electrode 10 and the substrate 2, the resistance determined by the electrolyte located between them is greater than at the points having the spacings d2 and d3. It is accordingly true that the current densities increase as the spacings d2 and d3 decrease. At the point of the spacing d3, the current density attains its maximum value and remains constant from then on, since this spacing d3 remains constant. The rounded outline of the alternating or three-phase current electrode 10 is composed of a parabolic portion C and an adjoining straight portion D. It is understood that the rounding of the alternating or three-phase current electrode 10 can also have a curved course other than a parabolic course.

The reduction in the electrical resistance in the electrolyte between the alternating or three-phase current electrode 10 and the substrate 2 leads to a gradual rise in the current density. Because of the great spacing d1 of the alternating or three-phase current electrode 10 from the substrate 2 at the beginning of the roughening zone, less current flows than is the case at the lesser spacing d2 or d3. Because the rise is only slight, the development of points of low and higher surface resistance is less than when the rise in current density is steep.

Figure 4:
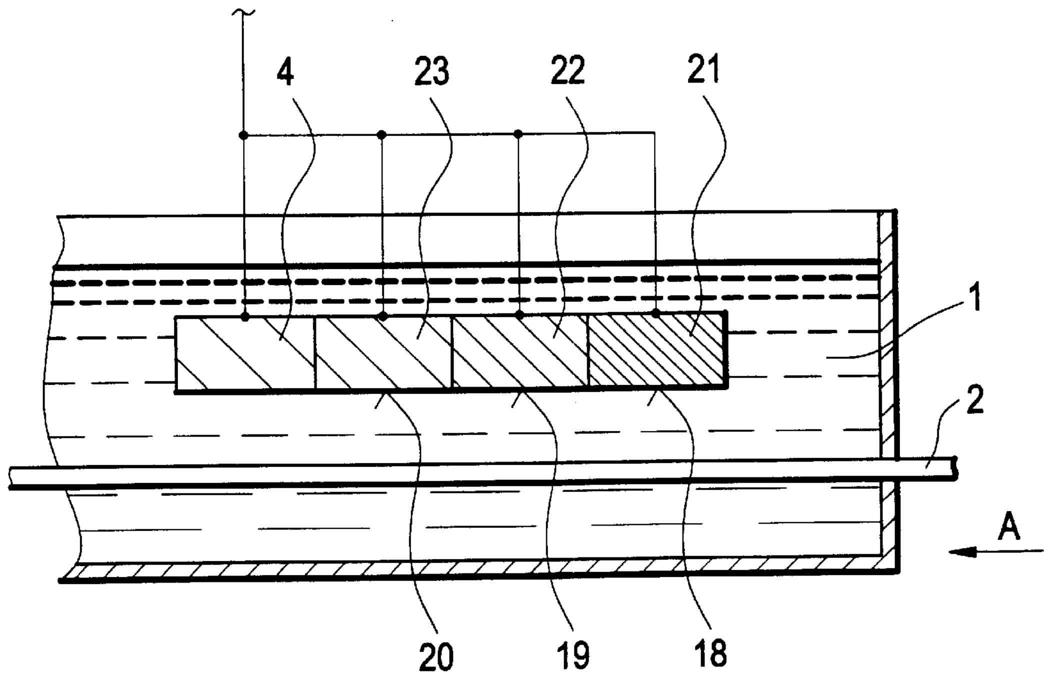
FIG. 4 schematically shows a second embodiment of the alternating or three-phase current electrode, which has electrode portions of differently conductive materials, in an apparatus according to the invention.

A second embodiment of the apparatus of the invention is schematically shown in FIG. 4. A first alternating or three-phase current electrode is subdivided into electrode portions 21, 22, 23. The electrode portions can be designed such that they have faces 18, 19, 20, oriented toward the substrate 2, that are of plane or sawtooth cross section, formed of rectangles or trapezoids, for instance so that gas bubbles forming in the electrolytic bath can be rapidly dissipated. The substrate 2 is transported through the electrolytic bath 1 in the transport direction A. The electrode portions 21, 22, 23 are followed by a further alternating or three-phase current electrode 4. The electrode portions 21, 22, 23 comprise materials that can have different electrical conductivities from one another and that have a different conductivity from the alternating or three-phase current electrode 4.

Figure 5:
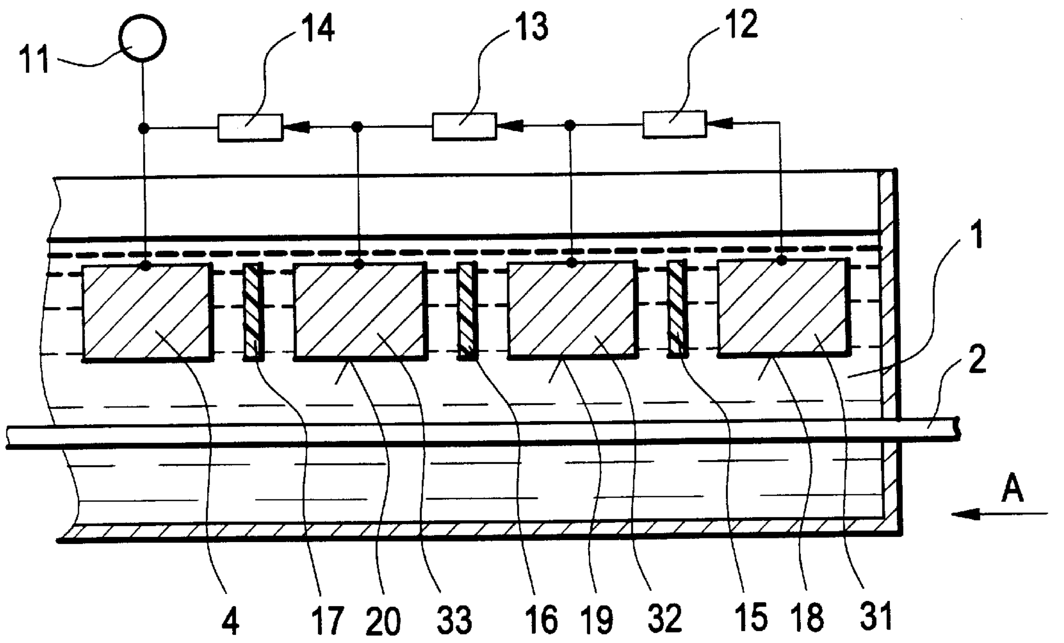
FIG. 5 shows a third embodiment of the alternating or three-phase current electrode, whose electrode portions are connected to fixed or variable ohmic resistors, in an apparatus according to the invention.

The third embodiment of the apparatus of the invention, shown in FIG. 5, includes a first alternating or three-phase current electrode that is subdivided into electrode portions 31, 32, 33 that are electrically insulated from one another. The substrate 2 is passed through the electrolyte bath 1 in the transport direction A. The electrode portions 31, 32, 33 are adjoined by a further alternating or three-phase current electrode 4. If the electrode portions and the electrode 4 are acted upon by three phase current, then a further three phase current electrode, not shown, is also present in the electrolytic bath 1. Each of the electrode portions 31, 32, 33 is connected in series (as shown) with or parallel to a fixed or variable ohmic resistor 12, 13, 14. Depending on whether the electrodes are alternating current electrodes or three phase current electrodes, the resistors 12, 13, 14 are connected via a terminal 11 to an alternating current source or a three phase current source, not shown.

Between the electrode portions 31, 32, 33 and the electrode 4, there are insulating plates 15, 16, 17, which prevent excessively high currents from flowing via the electrolyte between the electrode portions. The current density per unit of surface area of the individual electrode portions 31, 32, 33 is less than the current density per unit of surface area of the alternating or three-phase current electrode 4. The specific ohmic resistance of the electrode portions 31, 32, 33, of the electrolyte, and the fixed or variable resistors 12, 13, 14 determine the applicable current density in the electrolyte between the faces 18, 19 and 20 and the substrate 2. By the appropriate selection of these resistances, the current densities are adjusted such that the current flowing through parts of the surface of the substrate 2 is largely independent of the surface resistance of the substrate 2 at the applicable points. By the selection of the fixed resistors or the adjustment of the variable resistors 12, 13, 14, the cross streaks are minimized.

Figure 6:
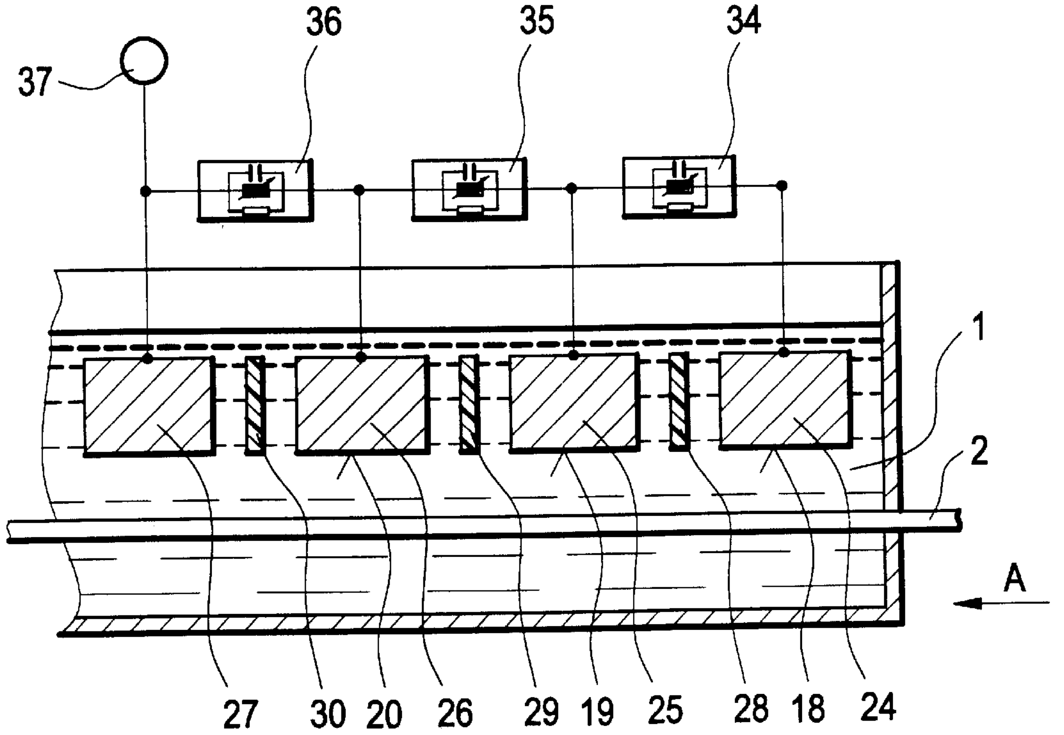
FIG. 6 shows a fourth embodiment of the alternating or three-phase current electrode, whose electrode portions are connected with a total resistance comprising ohmic and/or inductive or capacitive resistors, in an apparatus according to the invention.

A fourth embodiment of the apparatus is shown schematically in FIG. 6. The embodiment of the first alternating or three-phase current electrode is similar to that of the second and third embodiments. This first alternating or three-phase current electrode is subdivided into electrode portions 24, 25, 26, which are disposed in the electrolyte bath 1, insulated from one another. In the transport direction A of the substrate 2, a further alternating or three-phase current electrode 27 follows. Between the electrode portions and the further electrode 27, there are insulating plates 28, 29 and 30. Each of the electrode portions 24, 25, 26 is connected to electrical components 34, 35, 36, each of which includes an ohmic resistor and/or inductive and capacitive resistor. The component 34 comprising ohmic and/or inductive and capacitive resistance of the electrode portion 24 is connected in series with or parallel to the components 35, 36 of the other electrode portions 25, 26 and is connected together with them, via a terminal 37, to an alternating current or three phase current source. The resistances of the electrode portions 24, 25, 26 that are definitive for the current flow in the electrolyte bath 1 are composed of the reactances of the inductances and capacitors in the components 34, 35, 36, which are indicated schematically in FIG. 6, and the ohmic resistances. It is known that the alternating current resistance is equal to the root of the sum of the squares of ohmic resistance and reactances. The reactive power caused by the reactive currents is not converted into heat. If the surface resistance of the substrate 2, which is essentially an ohmic resistor, changes, then the change in reactance will be less than would be the case with a purely ohmic total resistance of the individual component.

Figure 7:
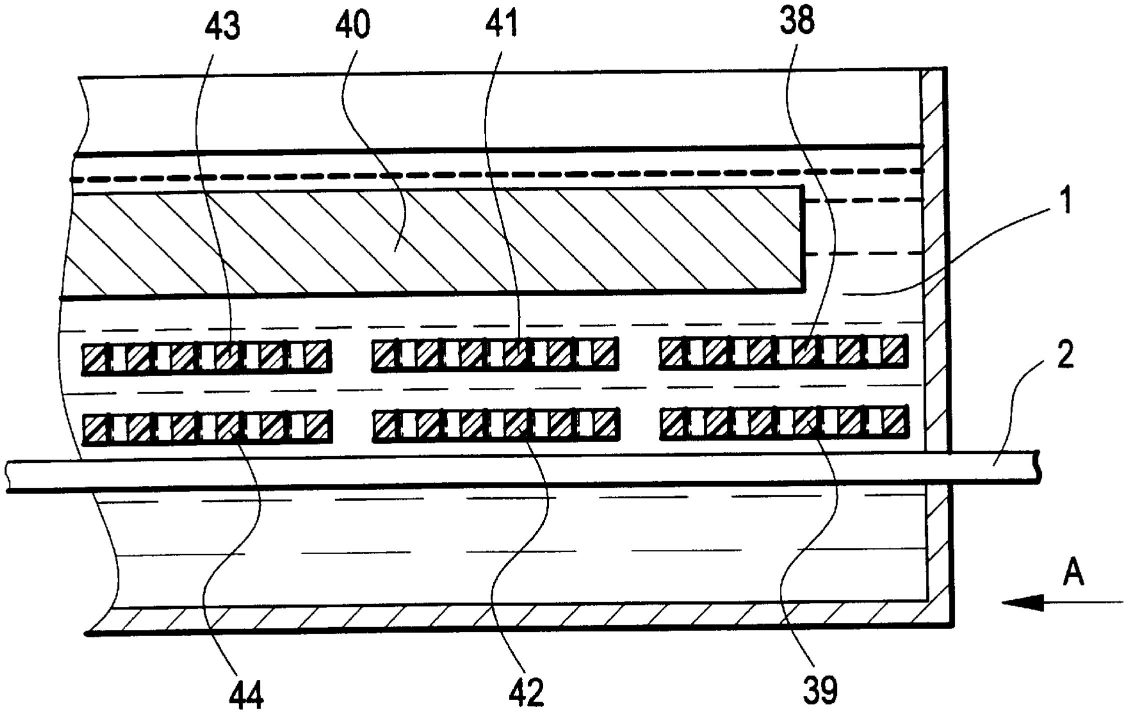
FIG. 7 shows a fifth embodiment of an alternating or three-phase current electrode, with pairs of perforated elements that are disposed between the electrode and a substrate transported through the electrolyte bath, in the apparatus of the invention.
Figure 8:
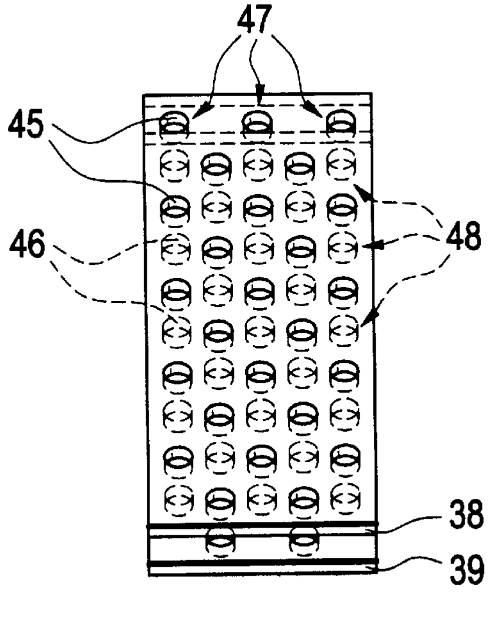
FIG. 8 is a plan view of a pair of perforated plates that are disposed between an alternating or three-phase current electrode and a substrate.

FIG. 7 shows a fifth embodiment of the apparatus, in which the first alternating or three-phase current electrode 40 in the electrolyte bath 1 is embodied in one piece and has an elongated rectangular cross section. The substrate 2 is passed in the transport direction A through the electrolytic bath 1 below perforated elements 38, 39; 41, 42; 43, 44. For the sake of adjustability, these perforated elements are embodied in the form of pairs in FIG. 8. They are located between the first alternating or three-phase current electrode 40 and the substrate 2. The pairs of elements are displaceable relative to one another, as shown in FIG. 8. By way of example, the elements 38, 39; 41, 42; 43, 44 comprise plates that have rows of perforations. In the outset position of the elements, the rows of perforations 47, 48 coincide. If the plate 38, 41 or 43 of one pair of elements that faces the alternating or three-phase current electrode 40 is displaced transversely to the transport direction A of the substrate 2, then the rows of perforations 47, 48 will coincide only in part of not at all, as can be seen from the individual perforations 45 of a row of perforations 47 and the perforations 46 of a row of perforations 48, which are indicated by dashed lines in FIG. 8. As a result of the partial coincidence of the rows of perforations 47, 48, the cross section of the openings uncovered by the perforations will become less. The smaller cross section for the conductive electrolyte leads to a higher ohmic resistance and thus a greater current density in the electrolyte bath 1 between the electrode 40 and the substrate 2. In operation, the displacement of the plates can be done in such a way that the first pair of elements 38, 39 in the transport direction A of the substrate 2 has a lesser coincidence of the rows of perforations 47, 48 than the next pair of elements 41, 42. For the third pair of elements 43, 44, for example, the rows of perforations 47, 48 then coincide fully, so that the current density in the electrolyte between the alternating or three-phase current electrode 40 and the substrate 2 is then at its highest.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A method for electrochemically roughening a substrate for light-sensitive layers, which comprises electrochemically roughening the surface of a metal substrate in an aqueous electrolyte bath by the application of an alternating or three-phase current to electrodes opposite the substrate while the substrate is transported continuously in a transport direction through the electrolyte bath in a roughening zone between the substrate and the first alternating or three-phase current electrode, wherein the roughening zone is defined by a series of lines which extend from points on the substrate directed perpendicularly to the electrodes; wherein at an entry point of the substrate into the roughening zone, the current density in the electrolyte bath between the first alternating or three-phase current electrode and the substrate is less than a maximum current density for the roughening, and that the current density between the substrate and the first alternating or three-phase current electrode increases continuously up to the maximum current density with increasing distance from the entry point wherein the spacing of the first alternating or three-phase current electrode from the substrate decreases continuously from the entry point into the roughening zone in the transport direction of the substrate until a constant spacing is attained.

2. The method of claim 1, wherein the increase in the current density in the electrolyte bath over the course of one period of the alternating or three-phase current amounts to less than 20% of the maximum current density.

3. The method of claim 1, wherein the first alternating or three-phase current electrode is subdivided into electrode portions of different materials, whose specific electrical conductivities differ from one another.

4. The method of claim 1 wherein the first alternating or three-phase current electrode is subdivided into electrode portions, and each electrode portion is connected to a fixed or variable ohmic resistor, and the size of the resistors is selected such that the current density in the electrolyte bath increases in the transport direction of the substrate.

5. The method of claim 1, wherein the first alternating or three-phase current electrode is subdivided into electrode portions, and each electrode portion is connected to ohmic and/or inductive and capacitive resistances, and the total resistance of the individual electrode portions comprising ohmic resistances and reactances comprising inductances and capacitances is selected such that the current density in the electrolyte bath increases in the transport direction of the substrate.

6. The method of claim 1 wherein perforated elements or pairs of perforated elements, whose conductivity is less than the conductivity of the electrolyte bath, are positioned between the first alternating or three-phase current electrode and the substrate.

7. The method of claim 6, wherein the elements of a pair are shiftable relative to one another.

* * * * *